United States Patent [19]

Blanchard

[11] Patent Number: 4,774,196
[45] Date of Patent: Sep. 27, 1988

[54] METHOD OF BONDING SEMICONDUCTOR WAFERS

[75] Inventor: Richard A. Blanchard, Los Altos, Calif.

[73] Assignee: Siliconix incorporated, Santa Clara, Calif.

[21] Appl. No.: 89,184

[22] Filed: Aug. 25, 1987

[51] Int. Cl.$^4$ .................. H01L 21/265; H01L 21/324
[52] U.S. Cl. ...................... 437/24; 437/247; 148/DIG. 3; 148/DIG. 135; 148/DIG. 150; 148/DIG. 45
[58] Field of Search ............... 437/24, 37, 247, 982, 437/941, 133, 134; 148/DIG. 135, DIG. 150, DIG. 3, DIG. 45

[56] References Cited

U.S. PATENT DOCUMENTS

| | | | |
|---|---|---|---|
| 3,328,210 | 6/1967 | McCaldin et al. | 437/24 |
| 3,332,137 | 7/1967 | Kenney | 29/423 |
| 3,595,719 | 7/1971 | Pomerantz et al. | 156/17 |
| 3,607,449 | 9/1971 | Tokuyama et al. | 437/37 |
| 4,007,294 | 2/1977 | Woods et al. | 437/24 |
| 4,599,792 | 7/1986 | Cade et al. | 148/DIG. 135 |
| 4,601,779 | 7/1986 | Abernathey et al. | 437/24 |
| 4,649,627 | 3/1987 | Abernathey et al. | 148/DIG. 135 |
| 4,672,354 | 6/1987 | Kurtz et al. | 156/633 |

OTHER PUBLICATIONS

Navon, *Electronic Material and Devices*, Houghton Mifflin, 1975, pp. 337-339.
Frye et al, "A Field-Assisted Bonding Process for Silicon Dielectric Isolation", *J. Electrochem. Soc.*, 133(8), Aug. 1986, pp. 1673-1677.
Brock, G. E., et al., *IBM Technical Disclosure Bulletin*, vol. 19, No. 9, Feb. 1977, pp. 3405-3406.
Gärtner, W., et al., *Applied Physics*, 12, 1977, pp. 137-148.
Kimura, M., et al., *Appied Physics Letters*, vol. 43, No. 3, Aug. 1, 1983, pp. 263-265.
Brooks, A. D., et al., *J. Electrochem. Soc.*, vol. 119, No. 4, Apr. 1972, pp. 545-546.
Wallis, G., et al, *J. of Applied Physics*, vol. 40, No. 10, Sep. 1969, pp. 3946-3949.

Primary Examiner—Brian E. Hearn
Assistant Examiner—T. N. Quach
Attorney, Agent, or Firm—Thomas S. MacDonald; Alan H. MacPherson; Paul J. Winters

[57] ABSTRACT

A method of fusing two or more semiconductor wafers involves growing a silicon dioxide planar layer on each of two polished silicon wafer substrates, implanting positive ions in the silicon dioxide layers on one wafer and negative ions in the silicon dioxide layer on the other wafer. The source of positive ions is preferably cesium and the source of negative ions is preferably boron. The implanted grown oxide layers are brought into abutment so electrostatic attraction forces of the oppositely charged ions keep the wafers together while they are exposed to a relatively high temperature in an oxygen ambient to fuse the abutting surfaces together.

16 Claims, 1 Drawing Sheet

METHOD OF BONDING SEMICONDUCTOR WAFERS

FIELD OF THE INVENTION

This invention relates to a method of bonding polished surfaces of semiconductor wafers together. More particularly, the invention is directed to a process of fusing of two or more silicon wafers together, which assembly is useful in production of dielectrically isolated or other semiconductor devices.

BACKGROUND OF THE INVENTION

The ability to fuse the polished and oxidized surfaces of silicon wafers has been reported in the literature "A Field-Assisted Bonding Process for Silicon Dielectric Isolation," R. C. Frye, J. E. Griffith, and Y. H. Wong, *Journal of the Electrochemical Society*, Vol. 133, No. 8, pp. 1673–1677 (August 1986). U.S. Pat. No. 4,672,354 discloses as part of a process of making pieoresistive pressure transducers in a semiconductor, electrostatic bonding of a glass layer of an $SiO_2$-coated first wafer to a facing high conductivity layer such as a cobalt containing layer diffused on a top surface of a second "sacrificial" wafer. After bonding of the two wafers, subsequent processing, including removal of all or part of the sacrificial wafer, is performed. While not directed to the bonding or fusion of wafers or substrates, the paper entitled "Electronic Conduction Mechanisms of Cs- and B- Implanted $SiO_2$ Films," W. Gartner and M. Schultz, *Applied Physics* 12, 137–148 (1977), discloses that implantation of certain atoms, particularly those of cesium and boron in a thermally grown silicon oxide film on MOS structures that cesium causes a positive space charge and boron forms a negative space charge. This apparently is true in a so-called "high field" region where implantation is performed at fields above 7 MV/cm.

SUMMARY OF THE INVENTION

The present invention is directed to a new wafer-to-wafer fusing technique that takes advantage of a positive charge purposely introduced just below the planar surface of a silicon dioxide surface of a first silicon wafer and a negative charge purposely introduced just below the planar surface of a silicon dioxide surface of a second silicon wafer. In one embodiment of the invention, silicon wafers are first polished as is conventionally done for device fabrication, and a layer of $SiO_2$ generally about 0.05–2.0 μm in thickness is thermally grown on at least the surfaces to be fused. An implantation of cesium ions forms a positive charge in the $SiO_2$ layer of the first wafer and an implantation of boron ions forms a negative charge in the $SiO_2$ layer of the second wafer. Appropriate implantation energy levels are employed to implant the ions to a depth sufficient to assure that the respective ions are not removed by any subsequent processing steps such as wafer cleaning prior to the final wafer-to-wafer fusing operation.

After implantation of the planar surfaces the respective wafers are placed in abutment with the implanted surfaces facing each other. The abutting wafers are then subjected to a heat treatment to fuse the abutting surfaces without any application of an electrical bias as in the Frye et al. article or as in the U.S. Pat. No. 4,672,354 patent. The respective implantation doses are chosen so that sufficient electrostatic attraction is present to hold the oxidized surfaces together until fusing occurs. It is also contemplated that in further processing steps to manufacture a specific semiconductor device such as a diode, transistor, or other integrated circuit device, that any residual implanted ions remain "buried" in the $SiO_2$ layer so as not to interfere with the manufacture or performance of the resulting device.

DETAILED DESCRIPTION OF THE DRAWINGS

Figure 1A:
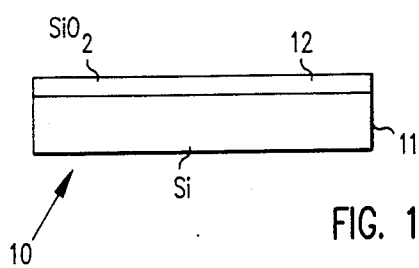
FIG. 1A is a schematic end view of a first semiconductor wafer illustrating oxide coating.
Figure 1B:
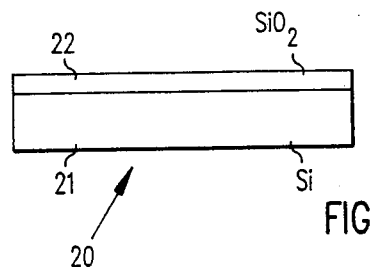
FIG. 1B is a schematic end view of a second semiconductor wafer illustrating oxide coating.
Figure 2A:
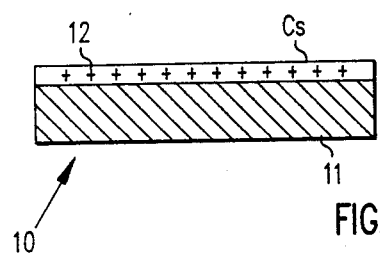
FIG. 2A is a schematic cross-sectional view of a first wafer illustrating positive ion implantation.
Figure 2B:
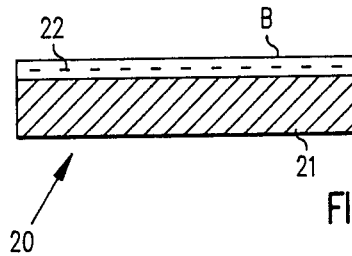
FIG. 2B is a schematic cross-sectional view of a second wafer illustrating negative ion implantation.

This invention is directed to a method of fusing a first oxide coated semiconductor substrate or wafer 10 with a second oxide coated wafer 20. As illustrated in FIGS. 1A and 1B, silicon wafers 11, 21 each being circular disks of approximately 7–20 cm in diameter and 10–40 mils in thickness and having a highly polished top surface, as is known in the art of wafer processing, is provided with silicon dioxide ($SiO_2$) isolation layers 12, 22. These layers are deposited on the silicon by thermal oxidation of the polished silicon surfaces in an oxygen ambient or may be formed by known chemical vapor deposition methods. The $SiO_2$ layers are typically about 3,000 Å in thickness although a thickness range of from about 0.01 microns to 2.0 microns is contemplated. Subsequently, $SiO_2$ layer 12 of a first wafer is subjected to an implantation step as in FIG. 2A to implant atoms, such as those of cesium, which introduces a positive ion charge just below the surface of the $SiO_2$ layer. It is theorized that the ions are then present in a generally planar band of $SiO_2$ about 200–600 Å below the $SiO_2$ surface. Likewise, as seen in FIG. 2B, an implantation of boron atoms providing negatively charged ions in the $SiO_2$ is separately performed on the second wafer. The chosen depth of ion implantation is dictated primarily by the energy and dose of the respective cesium and boron implants. Energy levels of from about 20 Kev to about 200 Kev and dosage concentrations of from about $1 \times 10^{11}$ to about $1 \times 10^{14}$ atoms/cm$^3$ should be employed for each separate implant when direct implantation with a beam of ions is employed. Direct implantation is described by Navon in *Electric Materials and Devices*, Houghton-Muffin (1975), page 337 et seq.

Figure 3:
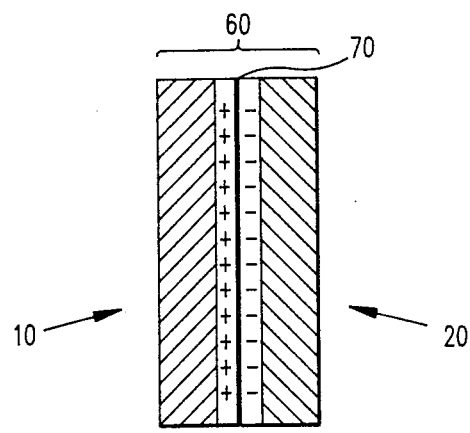
FIG. 3 is a schematic cross-sectional view of the steps of abutting and fusing of facing implanted $SiO_2$ surfaces of the first and second wafers.

Wafers 10 and 20 are next brought into abutment as seen at 60 in FIG. 3, with their polished, oxidized and implanted surfaces abutting against each other and placed in a high temperature diffusion furnace at about 800° C. to about 1,200° C. for a sufficient time to accomplish the fusing and formation of fused surface 70 across the abutting wafer surfaces. This may be of from about one-half hour to one hour. The attractive electrostatic forces, resulting from the implantation of the positive ions to a surface of one wafer and negative ions to a facing surface of a second wafer, hold the wafers together during fusing without any mechanical clamping or imposition of anodic current through the composite structure.

It is contemplated that charged positive and negative ion species other than boron and cesium may be employed as implant materials. These include positively charged ions of sodium as well as other atoms and negatively charged ions of iodine as well as other atoms. The wafers preferably are made from single crystal silicon, but may be polycrystalline silicon, or a layer of polycrystalline silicon on a single crystal wafer. In the method described various cleaning steps, as are practiced in the semiconductor processing art, may be employed at various stages of the fusing preparation method. For example, cleaning utilizing a solution of sulfuric acid at temperature of about 100° C. is normally done after the implantation step and before the fusing step.

The invention also includes bonding three or more wafers together at one time by having facing surfaces of each of the wafers implanted one with negatively charged ions the other with positively charged ions. The presence of residual positive and negative ions adjacent the resultant fused surfaces is not generally of concern since subsequent processing steps such as isolation or etching may be employed to remove the effect of such ions or subsequent processing is restricted to regions of the fused wafers away from the permanent fused bond and any residual implantation.

The above-described implantation and fusing techniques was demonstrated by the following experiment. Two silicon single crystal wafers with 3,000 Å of thermally grown silicon oxide thereon were ion implanted; one wafer with boron at 100 Kev with a dose of 1 E 13 ($1 \times 10^{13}$ atoms/cm$^3$) and a second wafer with cesium at the same energy and dose as the boron implant. The two wafers were placed in a special quartz holder with vertical slots that were large enough for the thickness of the two wafers plus 5 mils. The wafers and holder were then placed in a standard diffusion furnace at 850° C. and the temperature was ramped to 1,000° C. for 30 minutes and then ramped down to 850° C. The ramping cycles were for 15 and 50 minutes, respectively, at constant rate 10° C./min up and 3° C./min down such that the overall fusing time was 95 minutes. The wafers, as a result of the above processing, Were observed as fused securely together. Subsequent success of fusing was demonstrated by grinding one side of the used wafers to thin them. The wafers remained fused even when grinding through the joint.

The above description of embodiments of this invention is intended to be illustrative and not limiting. Other embodiments of this invention will be obvious to those skilled in the art in view of the above disclosure.

I claim:

1. A method of fusing a first semiconductor wafer to a second semiconductor wafer comprising the steps of:
   depositing an insulating layer of a compound of said semiconductor on planar surfaces of each said first and second semiconductor wafers;
   implanting a first implant material on one of said planar surfaces in the insulating layer of one of said wafers to provide positive ions of said first implant material in said insulating layer of one of said wafers;
   implenting a second implant material on another of said planar surfaces in the insulating layer of the other of said wafers to provide negative ions of said second implant material in said insulating layer of said other of said wafers;
   abutting said implanted planar surfaces and insulating layers of said wafers in facing relationship such that said wafers are held in contact by electrostatic attraction between said implanted positive and negative ions; and
   exposing said abutting wafers for a time and at a fusing temperature sufficient to fuse said implanted insulating layers together.

2. A method as set forth in claim 1 in which said semiconductor wafers are single crystal silicon wafers.

3. A method as set forth in claim 2 in which said insulation layers are silicon dioxide.

4. A method as set forth in claim 3 in which said first implant material is cesium and said second implant material is boron.

5. A method as set forth in claim 4 in which said implanting of cesium and boron ions is done at an implantation energy level of from about 20 Kev to about 200 Kev and at a dosage concentration of from about $1 \times 10^{11}$ to about $1 \times 10^{14}$ atoms/cm$^3$.

6. A method as set forth in claim 5 in which the abutting implanted wafers are exposed to an oxygen ambient at a fusing temperature of from about 1,000° C. to 1,200° C. for from about 30 to about 60 minutes.

7. A method as set forth in claim 6 in which said cesium and boron are implanted utilizing an energy of about 100 Kev and with a dosage of about $1 \times 10^{13}$ atoms/cm$^3$.

8. A method as set forth in claim 2 in which said first implant material is cesium and said second implant material is boron.

9. A method as set forth in claim 1 in which said semiconductor wafers are polycrystalline silicon wafers.

10. A method as set forth in claim 9 in which said insulating layers are silicon dioxide.

11. A method as set forth in claim 1 in which said semiconductor wafers are polycrystalline silicon or single crystal silicon.

12. A method as set forth in claim 11 in which said insulating layer is silicon dioxide.

13. A method as set forth in claim 1 in which said first implant material is cesium and said second implant material is boron.

14. A method as set forth in claim 1 in which said fusing temperature is from about 1,000° C. to about 1,200° C.

15. A method of fusing a first semiconductor wafer to a second semiconductor wafer comprising the steps of:
   providing a first wafer of semiconductor material having a first planar surface;
   providing a second wafer of semiconductor material having a second planar surface;
   growing an oxide of said semiconductor material on each of said planar surfaces;
   implanting a first implant material in said grown oxide on one of said planar surfaces to provide positive ions of said first implant material in said grown oxide;
   implanting a second implant material in said grown oxide on the other of said planar surfaces to provide negative ions of said second implant material in said grown oxide;
   contacting said positive ion implanted grown oxide on said one of said wafers with said negative ion implanted grown oxide on the other of said wafers; and exposing said wafers and their implanted grown oxides to a temperature and to a time sufficient to fuse said implanted grown oxides to each other.

16. A method as set forth in claim 15 in which said semiconductor material is silicon, said grown oxide is silicon dioxide, said first implant material is cesium, and said second implant material is boron.

* * * * *